United States Patent
Reeder

(10) Patent No.: US 7,202,665 B1
(45) Date of Patent: Apr. 10, 2007

(54) MAGNETIC RESONANCE SPECTROSCOPY OF SPECIES WITH MULTIPLE PEAKS

(75) Inventor: Scott Brian Reeder, Middleton, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 11/406,645

(22) Filed: Apr. 19, 2006

(51) Int. Cl.
*G01V 3/00* (2006.01)

(52) U.S. Cl. .................................. 324/307; 324/309

(58) Field of Classification Search ........ 324/300–322; 600/410–445
See application file for complete search history.

(56) References Cited

U.S. PATENT DOCUMENTS

| | | | |
|---|---|---|---|
| 6,181,134 B1 * | 1/2001 | Wald | 324/307 |
| 6,470,202 B2 * | 10/2002 | Rosenfeld | 600/410 |
| 6,674,897 B1 * | 1/2004 | Sugisaki et al. | 382/166 |
| 6,677,750 B2 | 1/2004 | Hennig et al. | |
| 6,856,134 B1 | 2/2005 | Reeder et al. | |
| 2005/0085713 A1 | 4/2005 | Reeder et al. | |

OTHER PUBLICATIONS

Scott B. Reeder, et al, Multicoil Dixon Chemical Species Separation With An Iterative Least-Squares Estimation Method; Mag. Reson. in Med. 51:35-45(2004).
Lars E. Olsson et al, MR Coronary Angiography in Pigs With Intraarterial Injections of a Hyperpolarized 13C Substance, Mag. Reson. in Med. 55:731-737 (2006).
Scott B. Reeder et al, Separation of 13C Metabolism with Chemical Shift Imaging; 2 pages, not dated.

* cited by examiner

*Primary Examiner*—Brij B. Shrivastav
(74) *Attorney, Agent, or Firm*—Quarles & Brady LLP

(57) ABSTRACT

Metabolite images are produced with an MRI system using a priori information about the resonant peaks of the metabolites and their relative sizes to reduce the amount of NMR data needed for proper spectral resolution. With the a priori information the acquired NMR signal is modeled. Using this model and NMR data acquired at a plurality of echo times (TE), the metabolite at each image pixel is calculated.

20 Claims, 5 Drawing Sheets

MAGNETIC RESONANCE SPECTROSCOPY OF SPECIES WITH MULTIPLE PEAKS

BACKGROUND OF THE INVENTION

The field of the invention is nuclear magnetic resonance imaging methods and systems. More particularly, the invention relates to the in vivo imaging of metabolites using paramagnetic labels such as hyperpolarized carbon-13.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, Mz, may be rotated, or "tipped", into the x-y plane to produce a net transverse magnetic moment Mt. A signal is emitted by the excited spins after the excitation signal $B_1$ is terminated, this signal may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

The advent of hyperpolarized (carbon-13) has spurred interest in imaging with this isotope in a variety of in vivo applications such as vascular imaging (MRA) and metabolic flux. One of these is C-13 labeled pyruvate and its metabolites (lactate and alanine), which are of particular interest in oncology applications. The NMR spectrum of these three metabolites is relatively sparse, making them well suited for chemical shift based imaging methods such as those commonly used to separately image water and fat. As shown in FIG. 2, these metabolites have a single peak for lactate (Lac), a single peak for alanine (AL) and two peaks for pyruvate (PE and Pyr). In a 3 Tesla polarizing field the chemical frequency shift of alanine is approximately −242 Hz relative to lactate, pyruvate has a main peak at approximately −622 Hz and a pyruvate ester peak lies at approximately −242 Hz relative to lactate.

The usual method for imaging these C-13 isotopes uses an echo planar spectroscopic imaging technique that requires the acquisition of large amounts of data. In order to resolve the spectral peaks for AL and PE it is necessary to acquire 64 NMR signal at different echo times. A large amount of data is needed to obtain the needed "spectral resolution" when a Fourier transformation is performed on the data to produce a spectrum. Because of the large amount of data that is acquired, a difficult choice between shorter scan time and higher spatial resolution is usually required.

Recently, a new method known as IDEAL was developed for imaging spin species such as fat and water. As described in U.S. Pat. No. 6,856,134 B1 issued on Feb. 15, 2005 and entitled "Magnetic Resonance Imaging With Fat-Water Signal Separation", the IDEAL method employs pulse sequences to acquire multiple images at different echo times (TE) and an iterative, linear least squares approach to estimate the separate water and fat signal components. The advantage of the IDEAL method is if the frequencies of the particular metabolites being imaged are known, the number of different echo time repetitions can be significantly reduced. This "a priori" information shortens scan time and enables more pulse sequence repetitions to be devoted to increased image resolution.

SUMMARY OF THE INVENTION

The present invention is a method for producing an MR image of a metabolite where the frequencies of the peak NMR signals produced by the metabolite are known and the relative values of the plurality of NMR peak signals produced by the metabolite are known. Using this a priori information the NMR signal can be modeled with an equation of relatively few unknowns. A corresponding relatively few MR images are acquired of the subject and from this acquired NMR image data and the equation, the signal components corresponding to the metabolite peak signals may be calculated and used to produce a metabolite image. The echo time (TE) is shifted in each of the acquired NMR images and the optimal echo time shift is determined to increase SNR of the measurement.

GENERAL DESCRIPTION OF THE INVENTION

The present invention enables the spectrum of a metabolite such as C-13 labeled pyruvate and its metabolites lactate and alanine to be efficiently produced when a priori information is known about the metabolites. More specifically, when the frequency of each peak in the metabolite NMR signal is known, this information can be used to substantially reduce the amount of NMR data that needs to be acquired to produce an image of the metabolite. In addition, where a single metabolite produces more than one signal peak, available a priori knowledge about the relative areas of the multiple signal peaks may also be used to substantially reduce the amount of NMR data that needs to be acquired.

Figure 2:
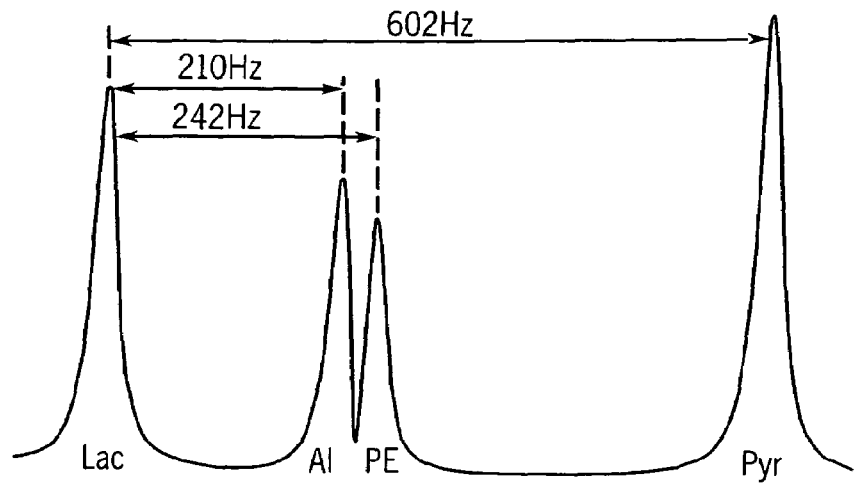
FIG. 2 is a graphic representation of the spectra produced by C-13 labeled pyruvate and its metabolites.

As shown in FIG. 2, the frequencies of the C-13 labeled pyruvate metabolites are known, as is the relative areas of the two pyruvate peaks PE and Pyr. The NMR signal from a voxel containing these three species measured at an echo time $t_n$ is then expressed as follows:

$$s(t_n) = (P_A e^{i2\pi f_A t_n} + P_L e^{i2\pi f_L t_n} + P_P(r_{P1} e^{i2\pi f_{P1} t_n} + r_{P2} e^{i2\pi f_{P2} t_n})) e^{i2\pi \psi t_n}$$

where: $P_A$, $P_L$ and $P_P$ are the total signal contributions from alanine, lactate and pyruvate respectively; $f_A$, $f_L$, $f_{P1}$ and $f_{P2}$ are the resonant frequencies of alanine, lactate, the main pyruvate peak and pyruvate ester peak; and $r_{P1}$ and $r_{P2}$ are the relative fractions of total signal from the two pyruvate peaks ($r_{P1} + r_{P2} = 1.0$).

The outer phase term in equation (1) results from the local polarizing magnetic field inhomogeneity ($\psi$) and this must be removed from the signals $S(t_n)$ before they can be used to compute the metabolite levels. The field inhomogeneity term $\psi$ can be estimated from the acquired signals $S(t_n)$ using an iterative method as described by Reeder et al, MRM, 51(1):123–30, 2004. With this approach at least four signals $S(t_n)$ must be acquired in order to solve for the four unknowns ($P_A$, $P_L$, $P_P$, $\psi$). Or the inhomogeneity ($\psi$) can be calculated from a proton density ($^1H$) calibration image that is separately acquired and used to produce a $B_0$ field inhomogeneity map. In this embodiment only three signals $S(t_n)$ need be acquired since $\psi$ is determined by the separate proton density image acquisition. This map indicates the field inhomogeneity $\psi$ at each image pixel in terms of a shift in the Larmor frequency from the nominal Larmor frequency. The phase created by the field inhomogeneity is demodulated from the acquired NMR signals $S(t_n)$ by multiplying the signal $S(t_n)$ by a phase term $e^{-i2\pi\psi t_n}$ to remove the effects of $B_0$ field inhomogeneities.

With the phase created by the field inhomogeneity removed, equation (1) can be rewritten as follows:

$$S = A\rho \qquad (2)$$

where:

$$S = [S(t_{TE1}), S](t_{TE2}) \ldots S(t_n)$$

$$\rho = [\rho_A, \rho_L, \rho_P]$$

$$A = \begin{bmatrix} C_1^A & C_1^L & C_1^P \\ C_2^A & C_2^L & C_2^P \\ \vdots & \vdots & \vdots \\ C_n^A & C_n^L & C_n^P \end{bmatrix}$$

with $$C_n^A = e^{i2\pi f_A t_n}$$

$$C_n^L = e^{i2\pi f_L t_n}$$

$$C_n^P = (r_{P1} e^{i2\pi f_{P1} t_n} + r_{P2} e^{i2\pi f_{P2} t_n})$$

If sufficient images are acquired at different echo times TE, all of the terms in the coefficient matrix A are known and estimates of the three metabolites ($\hat{P}$) may then be calculated from the pseudo-inverse of equation (2):

$$\hat{P} = (A^H A)^{-1} A^H S \qquad (3)$$

where "$^H$" denotes the Hermitian transpose. In the case of C-13 labeled pyruvate, three images are required at a minimum. Obviously, this is a substantial reduction in scan time over prior methods which require 64 images to provide the needed spectral resolution.

Different echo times are needed in the n=3 images and the changes, or shifts in echo time TE can be chosen to maximize the SNR performance of the the effective number of signal averages (NSA). NSA is easily calculated for each species as the inverse of each diagonal term in the covariance matrix:

$$NSA = 1/((A^H A)^{-1})_{m,n} \qquad (4)$$

where:
m=1 for alanine,
m=2 for lactate, and
m=3 for pyruvate.

Figure 4:
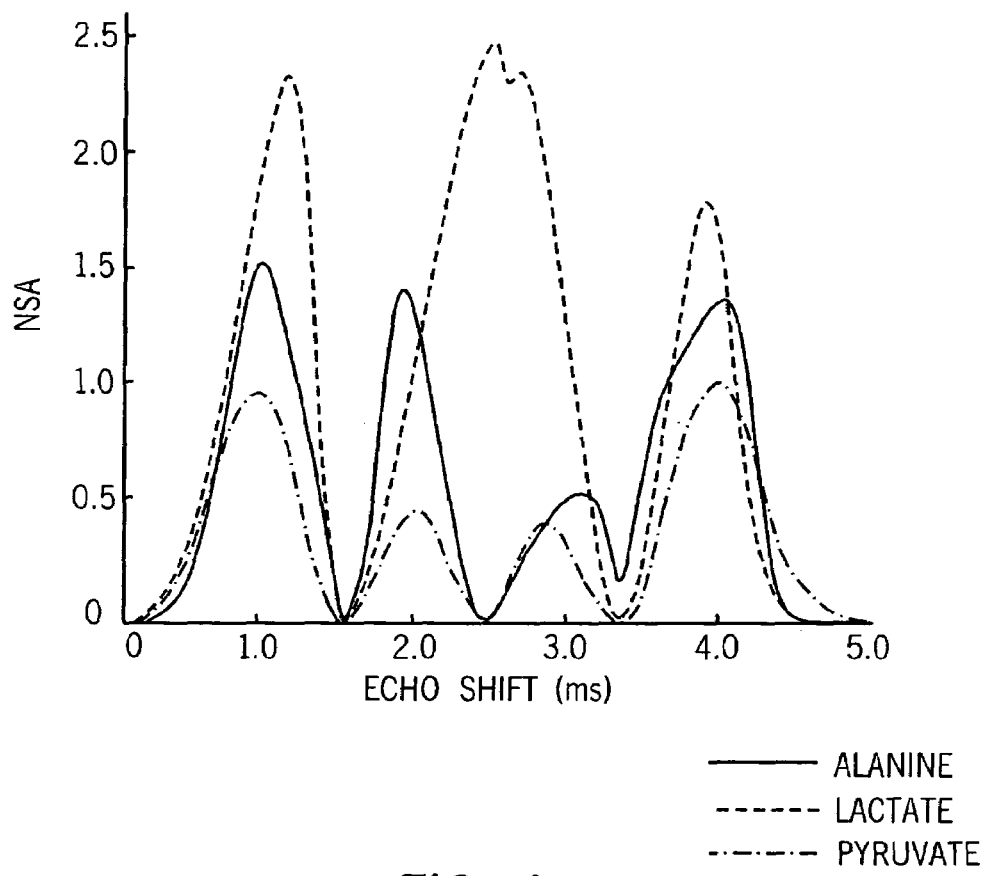
FIG. 4 is a graphic representation of the NSA plot for the metabolites of FIG. 2.

The NSA values can be calculated for different echo shifts in order to maximize the NSA for some or all the metabolites, determining the optimum echo spacing that will maximize noise performance. For example, FIG. 4 shows the NSA performance for three equally spaced echoes for the case where the field map ($\psi$) is known or measured using an external calibration. From this plot, it can be determined that an echo spacing of approximately 1.0 ms will provide excellent NSA for all three metabolites. This is one possible echo combination that will provide good noise performance for the decomposition of the three species, however other combinations of echoes, including unequally spaced echoes can be used for this form of optimization.

Figure 6:
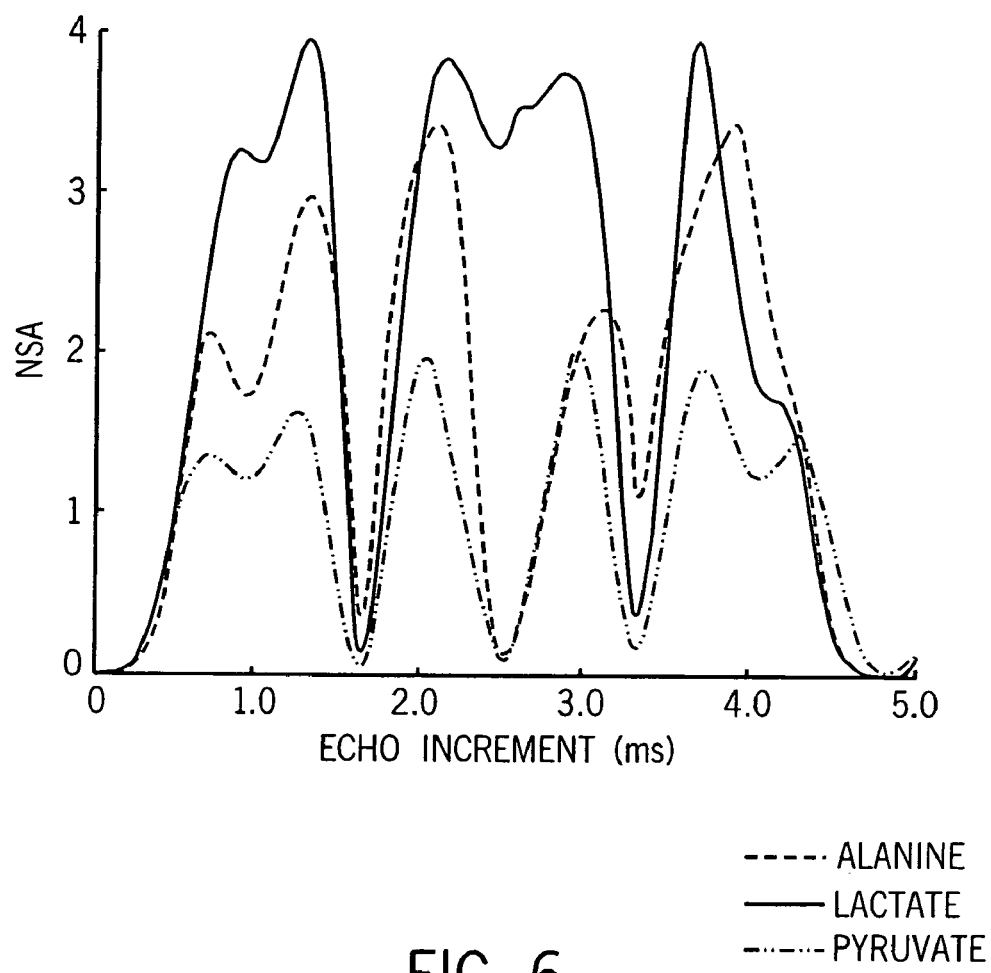
FIG. 6 is a graphic representation of the NSA plot of the metabolites of FIG. 2 in a four echo acquisition.

More than three echoes can also be used to decompose the three species. Not all pulse sequences are sufficiently flexible in their timing to achieve the optimal echo spacing, for example, 1.0 ms. For this reason it may be advantageous to acquire more than 3 echoes, in order to match the capabilities of the pulse sequence with an optimal echo combination. For example, FIG. 6 plots the NSA for the same decomposition using 4 echoes. An optimal spacing occurs at spacings of 1.4 ms or 2.1 ms. Thus, if a pulse sequence is unable to achieve an echo spacing of 1.0 ms for performing the preferred 3 echo decomposition, it might be advantageous to perform a four echo acquisition using an echo spacing 1.4 ms or 2.1 ms.

DESCRIPTION OF THE PREFERRED EMBODIMENT

Figure 1:
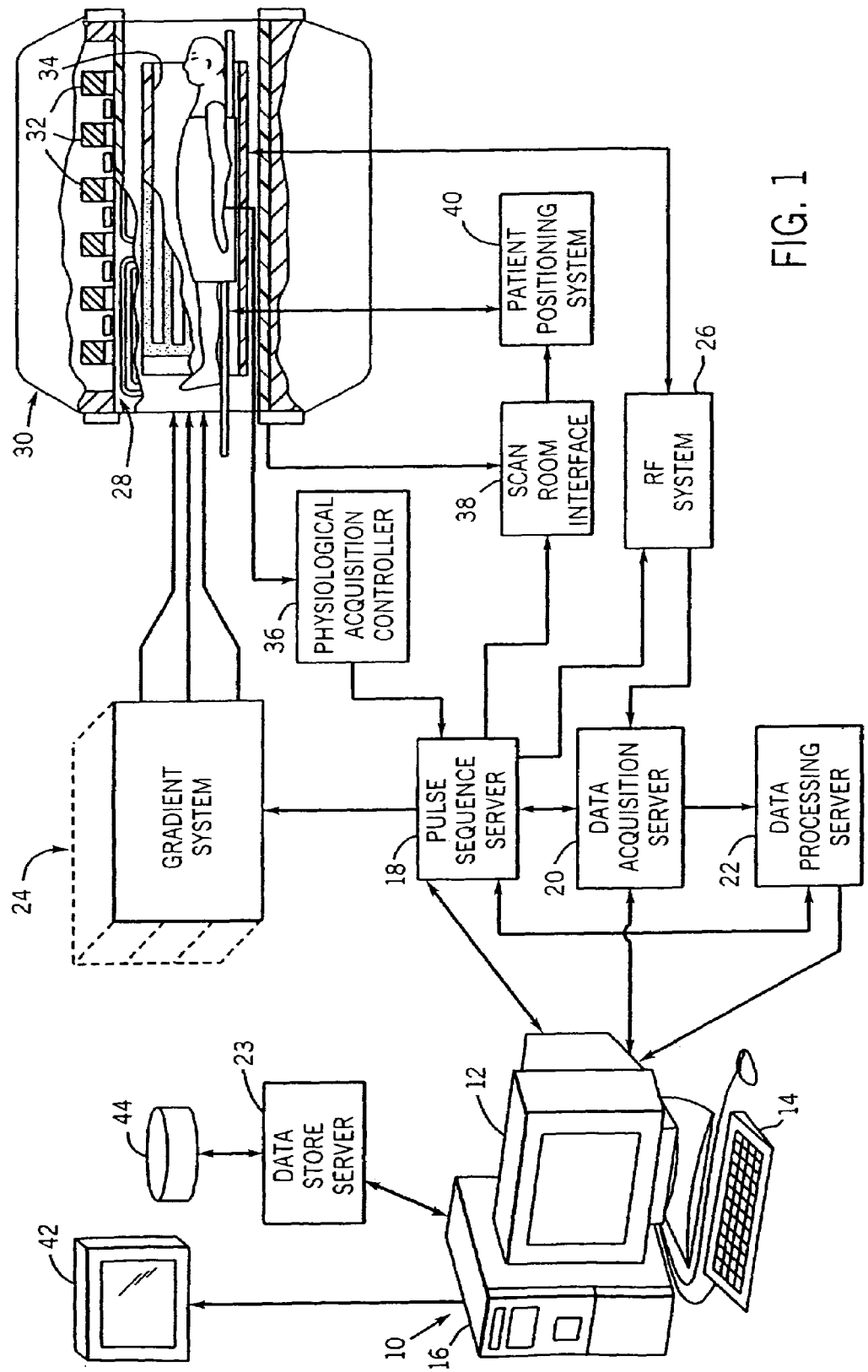
FIG. 1 is a block diagram of an MRI system which employs the present invention.

Referring particularly to FIG. 1, the preferred embodiment of the invention is employed in an MRI system. The MRI system includes a workstation 10 having a display 12 and a keyboard 14. The workstation 10 includes a processor 16 which is a commercially available programmable machine running a commercially available operating system. The workstation 10 provides the operator interface which enables scan prescriptions to be entered into the MRI system.

The workstation 10 is coupled to four servers: a pulse sequence server 18; a data acquisition server 20; a data processing server 22, and a data store server 23. In the preferred embodiment the data store server 23 is performed by the workstation processor 16 and associated disc drive interface circuitry. The remaining three servers 18, 20 and 22 are performed by separate processors mounted in a single enclosure and interconnected using a 64-bit backplane bus. The pulse sequence server 18 employs a commercially available microprocessor and a commercially available quad communication controller. The data acquisition server 20 and data processing server 22 both employ the same commercially available microprocessor and the data processing server 22 further includes one or more array processors based on commercially available parallel vector processors.

The workstation 10 and each processor for the servers 18, 20 and 22 are connected to a serial communications network. This serial network conveys data that is downloaded to the servers 18, 20 and 22 from the workstation 10 and it conveys tag data that is communicated between the servers and between the workstation and the servers. In addition, a high speed data link is provided between the data processing server 22 and the workstation 10 in order to convey image data to the data store server 23.

The pulse sequence server 18 functions in response to program elements downloaded from the workstation 10 to operate a gradient system 24 and an RF system 26. Gradient waveforms necessary to perform the prescribed scan are produced and applied to the gradient system 24 which excites gradient coils in an assembly 28 to produce the magnetic field gradients $G_x$, $G_y$, and $G_z$ used for position encoding NMR signals. The gradient coil assembly 28 forms part of a magnet assembly 30 which includes a polarizing magnet 32 and a whole-body RF coil 34. In the preferred embodiment a 3.0 Tesla scanner sold by General Electric under the trademark "SIGNA" is employed.

RF excitation waveforms are applied to the RF coil 34 by the RF system 26 to perform the prescribed magnetic resonance pulse sequence. Responsive NMR signals detected by the RF coil 34 are received by the RF system 26, amplified, demodulated, filtered and digitized under direction of commands produced by the pulse sequence server 18. The RF system 26 includes an RF transmitter for producing a wide variety of RF pulses used in MR pulse sequences. The RF transmitter is responsive to the scan prescription and direction from the pulse sequence server 18 to produce RF pulses of the desired frequency, phase and pulse amplitude waveform. The generated RF pulses may be applied to the whole body RF coil 34 or to one or more local coils or coil arrays.

The RF system 26 also includes one or more RF receiver channels. Each RF receiver channel includes an RF amplifier that amplifies the NMR signal received by the coil to which it is connected and a quadrature detector which detects and digitizes the I and Q quadrature components of the received NMR signal. The magnitude of the received NMR signal may thus be determined at any sampled point by the square root of the sum of the squares of the I and Q components:

$$M=\sqrt{I^2+Q^2},$$

and the phase of the received NMR signal may also be determined:

$$\phi = \tan^{-1} Q/I.$$

In the preferred embodiment a dual-tuned, proton-carbon transmit and receive local coil is employed such as that described in U.S. Pat. No. 4,799,016 entitled "Dual Frequency NMR Surface Coil."

The pulse sequence server 18 also optionally receives patient data from a physiological acquisition controller 36. The controller 36 receives signals from a number of different sensors connected to the patient, such as ECG signals from electrodes or respiratory signals from a bellows. Such signals are typically used by the pulse sequence server 18 to synchronize, or "gate", the performance of the scan with the subject's respiration or heart beat.

The pulse sequence server 18 also connects to a scan room interface circuit 38 which receives signals from various sensors associated with the condition of the patient and the magnet system. It is also through the scan room interface circuit 38 that a patient positioning system 40 receives commands to move the patient to desired positions during the scan.

It should be apparent that the pulse sequence server 18 performs real-time control of MRI system elements during a scan. As a result, it is necessary that its hardware elements be operated with program instructions that are executed in a timely manner by run-time programs. The description components for a scan prescription are downloaded from the workstation 10 in the form of objects. The pulse sequence server 18 contains programs which receive these objects and converts them to objects that are employed by the run-time programs.

The digitized NMR signal samples produced by the RF system 26 are received by the data acquisition server 20. The data acquisition server 20 operates in response to description components downloaded from the workstation 10 to receive the real-time NMR data and provide buffer storage such that no data is lost by data overrun. In some scans the data acquisition server 20 does little more than pass the acquired NMR data to the data processor server 22. However, in scans which require information derived from acquired NMR data to control the further performance of the scan, the data acquisition server 20 is programmed to produce such information and convey it to the pulse sequence server 18. For example, during prescans NMR data is acquired and used to calibrate the pulse sequence performed by the pulse sequence server 18. Also, navigator signals may be acquired during a scan and used to adjust RF or gradient system operating parameters or to control the view order in which k-space is sampled. And, the data acquisition server 20 may be employed to process NMR signals used to detect the arrival of contrast agent in an MRA scan. In all these examples the data acquisition server 20 acquires NMR data and processes it in real-time to produce information which is used to control the scan.

The data processing server 22 receives NMR data from the data acquisition server 20 and processes it in accordance with description components downloaded from the workstation 10. Such processing include Fourier transformation of raw k-space NMR data to produce two or three-dimensional images; the application of filters to a reconstructed image and the reconstruction of the metabolic images according to the present invention.

Images reconstructed by the data processing server 22 are conveyed back to the workstation 10 where they are stored. Real-time images are stored in a data base memory cache (not shown) from which they may be output to operator display 12 or a display 42 which is located near the magnet assembly 30 for use by attending physicians. Batch mode images or selected real time images are stored in a host database on disc storage 44. When such images have been reconstructed and transferred to storage, the data processing server 22 notifies the data store server 23 on the workstation 10. The workstation 10 may be used by an operator to archive the images, produce films, or send the images via a network to other facilities.

Figure 3:
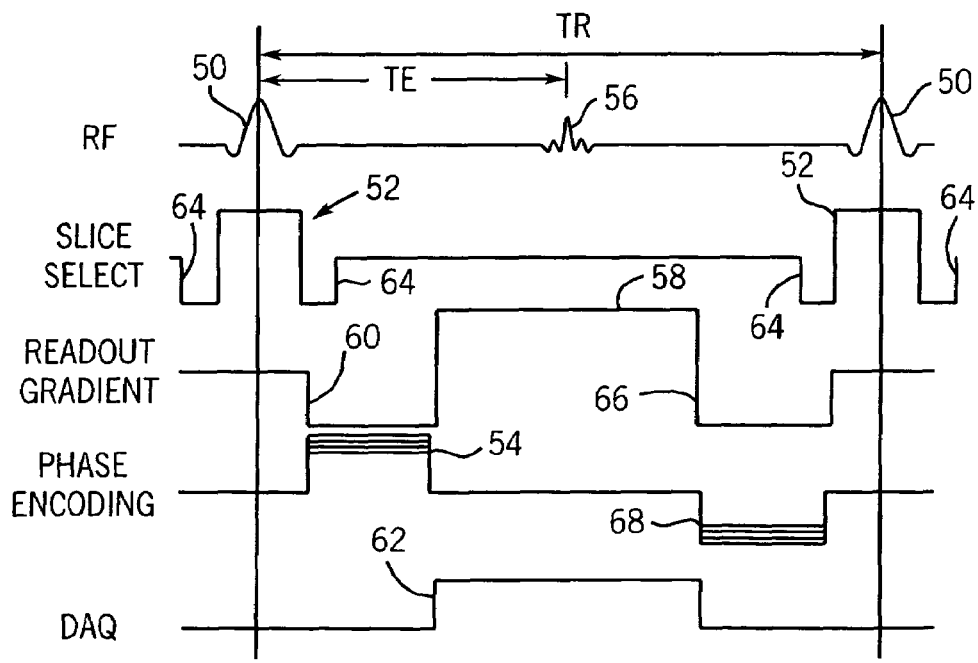
FIG. 3 is a graphic representation of a preferred pulse sequence used to direct the operation of the MRI system of FIG. 1.

A number of different pulse sequences can be used to direct the MRI system to acquire the data needed to practice the present invention. In the preferred embodiment a pulse sequence as shown in FIG. 3 is employed which uses the steady state free precision (SSFP) principle. It includes a selective rf excitation pulse 50 that is repeated at the start of each TR period as well as a slice select gradient pulse 52 that is produced concurrently with the rf pulse 50 to produce transverse magnetization in a prescribed slice. After excitation of the spins in the slice a phase encoding gradient pulse 54 is applied to position encode the NMR signal 56 along one direction in the slice. A readout gradient pulse 58 is also applied after a dephasing gradient lobe 60 to position encode the NMR signal 56 along a second, orthogonal direction in the slice. The NMR signal 56 is sampled during a data acquisition window 62. To maintain the steady state condition, the integrals of the three gradients each sum to zero. To accomplish this rephasing lobes 64 are added to the slice select gradient waveform, a rephasing lobe 66 is added to the readout gradient waveform and a rewinder gradient lobe 68 is added to the phase encoding gradient waveform. As is well known in the art, the pulse sequence is repeated and the amplitude of the phase encoding gradient 54 and its equal, but opposite rewinder 68 are stepped through a set of values to sample 2D k-space in a prescribed manner. As will be explained in more detail below, each slice is acquired three or more times and the echo time TE increment is set to 1.0 ms during successive acquisitions.

Figure 5:
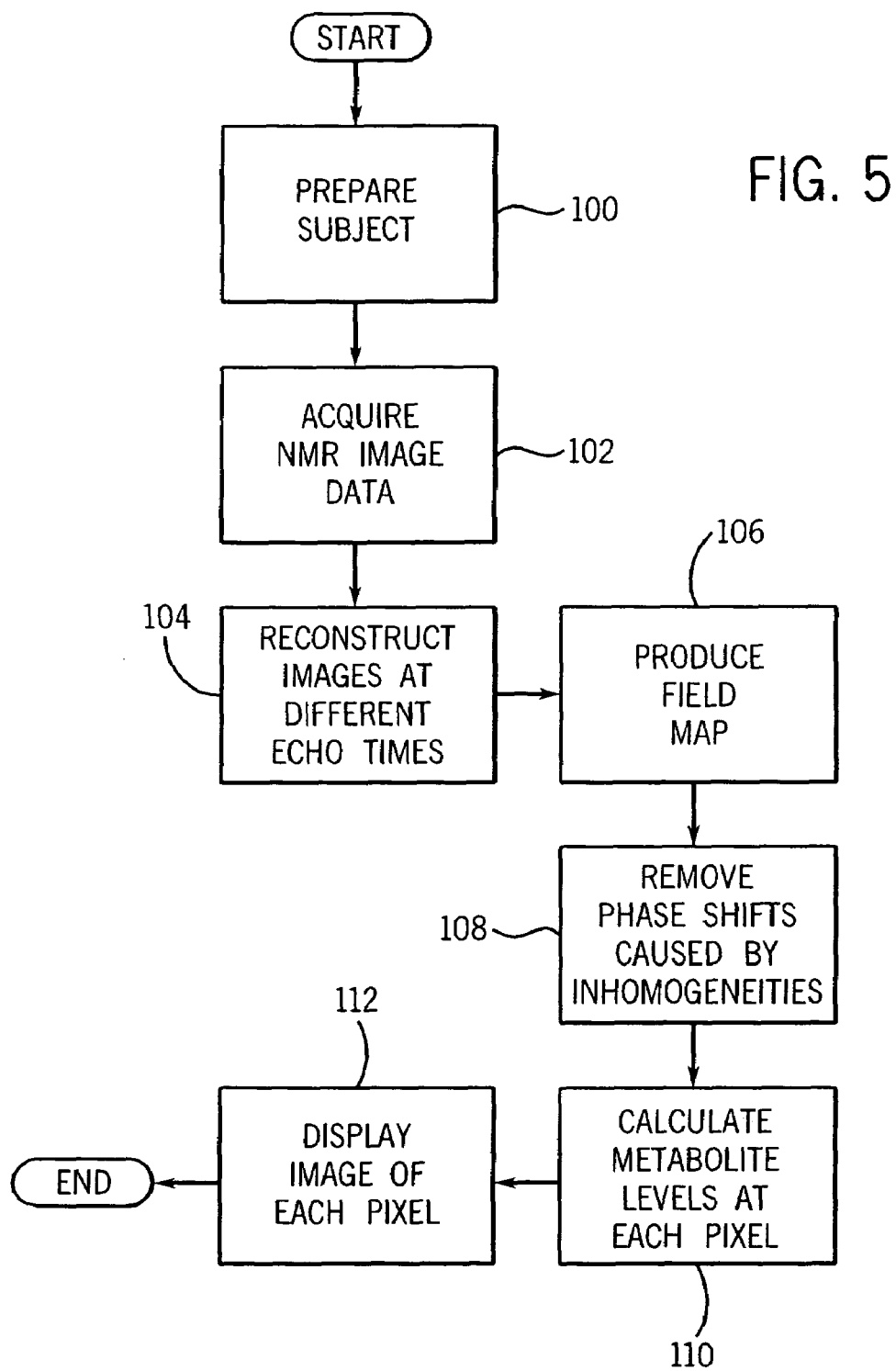
FIG. 5 is a flow chart illustrating the steps used to practice the preferred embodiment of the invention.

Referring particularly to FIG. 5, the first step in performing a C-13 metabolite scan is to prepare the subject as indicated at process block 100. This includes injection of nonhyperpolarized or hyperpolarized C-13 labeled pyruvate from a suitable source such as a polarizer device.

A scan is then conducted with the above MRI system using the above described pulse sequence to acquire spectroscopic image data as indicated at process block 102. Three images at three different echo times TE are acquired at each prescribed slice location. This provides sufficient information when combined with a prior information concerning the metabolite signal to produce images of the metabolites alanine, lactate and pyruvate.

As indicated at process block 104 the next step is to reconstruct the three images at each slice location. This is done in the usual manner by performing a two-dimensional, complex Fourier transformation of the acquired k-space data. As a result, three NMR signals $S(t_{TE1})$, $S(t_{TE2})$ and $S(t_{TE3})$ are produced for each pixel location in each slice.

A field map ($\psi$) is produced next as indicated at process block 106. As indicated above, this can be done by either using an iterative method described by S. B. Reeder et al in "Multicoil Dixon Chemical Species Separation With An Iterative Least-Squares Estimation Method", MRM, 51:35–45 (2004), or a separate scan can be performed to acquire a proton calibration image from which the phase error $\psi$ is determined at each image pixel as discussed above. The phase shifts caused by inhomogeneities in the scanner polarizing magnetic field are then demodulated from the images as described above and indicated at process block 108.

As indicated at process block 110, the metabolite component of the signals at each slice image pixel is then calculated using the corrected image signals $S(t_{TE1})$, $S(t_{TE2})$ and $S(t_{TE3})$ and the above equation (3). The values of the metabolite signals $\rho_A$, $\rho_L$ and $\rho_P$ are thus calculated at each slice image pixel. These can be displayed as separate metabolite images as indicated at process block 112, or the three separate metabolite images can be combined into a single image with different color coding for each metabolite. It is also possible to acquire during the scan a proton image and reconstruct a high resolution anatomical image of each slice. The metabolite image or images may be registered and displayed in color with the anatomical image forming a black and white background.

It should be apparent to those skilled in the art that many variations are possible from the above described preferred embodiment. For example, many other pulse sequences can be used to acquire the NMR data and different image reconstruction methods can be used. For example, a pulse sequence that samples k-space along a radial path can be used and the images reconstructed using a backprojection technique. Also, other metabolites may be imaged using the present invention where sufficient a priori information is known about the frequency of their NMR signal peaks and the relative values of their multiple peaks.

The decomposition described in Equations 1–3 is preferably performed in image space. So long as the field map ($\psi$) can be ignored or has been demodulated from the source data, the signal, as described in Equation 1 is a linear system, which will also hold after Fourier transformation into k-space. This permits separation of the k-space signals of the chemical species into separate data matrices. After separation of the k-space data, the Fourier transform is performed to yield images of each metabolite. In general, however, it is more convenient to perform calculations in image space if the field map (which makes Equation 1 a non-linear equation) is non-zero, creating position dependent phase shifts.

The invention claimed is:

1. A method for producing an image of a metabolite with a magnetic resonance imaging (MRI) system, the steps comprising:
    a) acquiring NMR image signals with the MRI system from a subject containing metabolites having known resonant frequencies under the direction of a pulse sequence having a first echo time (TE);
    b) repeating step a) under the direction of a pulse sequence having a different echo time (TE);
    c) reconstructing images from the NMR image signals acquired in step a) and step b);
    d) calculating the signal produced by one of said metabolites at each image pixel using the reconstructed image signals at each pixel and an equation derived from a model NMR signal;
    wherein the model NMR signal includes a term for each metabolite that has a single known resonant frequency, and further terms for each of a plurality of known resonant frequencies of another metabolite along with factors that indicate the known relative values of NMR signals at each of said plurality of known resonant frequencies.

2. The method as recited in claim 1 in which the metabolites include lactate, alanine and pyruvate having known resonant frequencies $f_A$, $f_L$ for lactate and alanine and two known resonant frequencies $f_{P1}$ and $f_{P2}$ for pyruvate.

3. The method as recited in claim 2 in which the model NMR signal is in the form:

$$s(t_n) = (P_A e^{i2\pi f_A t_n} + P_L e^{i2\pi f_L t_n} + P_P (r_{P1} e^{i2\pi f_{P1} t_n} + r_{P2} e^{i2\pi f_{P2} t_n})) e^{i2\pi \psi t_n}$$

where $P_A$, $P_L$ and $P_P$ are the signal contributions from alanine, lactate and pyruvate respectively, $r_{p1}$ and $r_{p2}$ are the known relative values of NMR signals at the two pyruvate resonant frequencies; $\psi$ is the field inhomogeneity in the MRI system, and $t_n$ is the echo time (TE) of the pulse sequence used to acquire the NMR signal.

4. The method as recited in claim 2 in which step a) is performed three times at three different echo times (TE).

5. The method as recited in claim 4 in which echo times (TE) differ from each other by approximately 1.0 milliseconds.

6. The method as recited in claim 1 in which step d) includes correcting the signal at each image pixel for inhomogeneity of an MRI system polarizing magnetic field.

7. The method as recited in claim 1 which includes:
    administering a paramagnetic label to the subject prior to performing step a).

8. The method as recited in claim 7 in which the paramagnetic label is Carbon-13.

9. The method as recited in claim 1 in which step a) is performed by repeatedly performing a pulse sequence that directs the MRI system to produce an rf excitation field at a selected Larmor frequency and to acquire a resulting NMR signal.

10. The method as recited in claim 9 in which the Larmor frequency of Carbon-13 is selected.

11. The method as recited in claim 9 in which the pulse sequence is a gradient-recalled echo pulse sequence.

12. The method as recited in claim 11 is a steady state free precession pulse sequence.

13. The method as recited in claim 1 which includes:
   determining a difference in echo time for use in setting the different echo time (TE) in step b) such that the NMR signals produced by the metabolites are optimized.

14. The method as recited in claim 13 in which the difference is approximately 1.0 milliseconds.

15. The method as recited in claim 1 in which step d) includes calculating the signal produced by each of said metabolites.

16. The method as recited in claim 15 which includes producing an image in which the metabolite signals calculated in step d) modulate the intensity at each image pixel and each metabolite produces a different color.

17. A method for producing an image of a metabolite with a magnetic resonance imaging (MRI) system, the steps comprising:
   a) acquiring NMR image signals with the MRI system from a subject containing metabolites having known resonant frequencies using a pulse sequence having a selected echo time (TE);
   b) repeating step a) a plurality of times using the pulse sequence and incrementing the echo time (TE) a selected amount for each repetition;
   c) establishing an equation derived from a model NMR signal that includes a term for each metabolite that has a single known resonant frequency, and further terms for each of a plurality of known resonant frequencies of another metabolite along with factors that indicate the known relative values of NMR signals at each of said plurality of known resonant frequencies; and
   d) reconstructing an image indicative of the signal produced by one of said metabolites at each image pixel using the acquired NMR image signals and the established equation.

18. The method as recited in claim 17 in which step d) includes:
   d)i) reconstructing images from the NMR image signals acquired in steps a) and b); and
   d)ii) calculating the signal produced by one of said metabolites at each image pixel using the reconstructed image signals at each pixel and the established equation.

19. The method as recited in claim 17 in which the metabolites include lactate, alanine and pyruvate having single known resonant frequencies for lactate and alanine and having two known resonant frequencies for pyruvate.

20. The method as recited in claim 18 in which step d) includes:
   d)iii) correcting the signal at each image pixel for inhomogeneity of an MRI system polarizing magnetic field.

* * * * *